United States Patent [19]

Kolc

[11] 4,291,642

[45] Sep. 29, 1981

[54] NOZZLE FOR DISPENSING VISCOUS FLUID

[75] Inventor: Ronald F. Kolc, Cherry Hill, N.J.

[73] Assignee: RCA Corporation, New York, N.Y.

[21] Appl. No.: 107,013

[22] Filed: Dec. 26, 1979

[51] Int. Cl.³ .............................................. B05C 5/02
[52] U.S. Cl. ..................................... 118/415; 118/50; 118/680; 118/401
[58] Field of Search ................. 118/415, 413, 401, 50, 118/671, 680; 33/169 F, DIG. 2; 401/193

[56] References Cited

U.S. PATENT DOCUMENTS

| | | | |
|---|---|---|---|
| 2,252,542 | 8/1941 | Beech | 118/415 X |
| 2,966,880 | 1/1961 | Gengenbach et al. | 118/671 |
| 3,111,431 | 11/1963 | Weaver | 118/408 X |
| 3,136,661 | 6/1964 | Thompson | 118/415 |
| 3,152,363 | 10/1964 | Honey et al. | 118/415 X |
| 3,961,599 | 6/1976 | Jones, Jr. | 118/410 X |
| 4,097,625 | 6/1978 | Lunn et al. | 118/415 X |
| 4,135,651 | 1/1979 | Hession et al. | 118/415 X |

Primary Examiner—John P. McIntosh
Attorney, Agent, or Firm—Samuel Cohen; Robert L. Troike; Robert Ochis

[57] ABSTRACT

A nozzle for use with a thick film dispensing system comprising a hollow tubular member having a fluid receiving port at one end and a fluid dispensing orifice at the other end. The hollow tubular member has a means coupled thereto for spacing and maintaining the fluid dispensing orifice a preselected distance away from a substrate surface. The use of this nozzle permits the uniform cross-section dispensing of a viscous thick film fluid on the substrate surface regardless of the curvature thereof.

6 Claims, 5 Drawing Figures

NOZZLE FOR DISPENSING VISCOUS FLUID

The present invention generally relates to a fluid dispensing nozzle and, in particular, relates to a nozzle for dispensing a viscous fluid uniformly onto a surface.

Viscous fluids, for example, thermoplastic inks adapted for use in fabricating thick film circuits and circuit elements, are often distributed onto a surface of a substrate through an orifice at the dispensing end of a nozzle. It is also common practice for the nozzle to be in relative motion with the substrate during the dispensing of the fluid. For example, U.S. Pat. No. 3,961,599, issued to Jones Jr., describes a system for the fabrication of thick film resistors wherein there is relative motion between the dispensing nozzle and the substrate upon which the resistor is formed. In thick film technology the shape of the orifice of the nozzle is designed to provide a conductive line having a particular thickness and width. In many instances it is advantageous, and often necessary, primarily because of the relatively high viscosity of the thick film fluid, to maintain the orifice a uniform distance from the substrate surface. By so doing, a line of uniform cross-section, i.e. uniform thickness and width, can be formed. Such uniformity in the cross-section of a line is important because even small variations in the cross-section of circuit lines can result in large variations in the resistivity thereof which can severely reduce the reliability of the thick film circuit.

A major obstacle in dispensing a line of uniform cross-section onto a thick film substrate, is the inherent camber of the substrate surface. To compensate for this camber the distance between the dispensing orifice of the nozzle and the surface of the substrate must be continuously adjusted. Heretofore, such compensation has been quite difficult to consistently achieve, particularly since the camber of each substrate is different.

In accordance with an embodiment of the present invention, a nozzle which comprises a hollow tubular member, having a dispensing orifice at one end for dispensing a thick film viscous fluid onto a substrate has means cooperatively connected thereto to maintain the orifice a predetermined spatial distance from the substrate.

In the drawing, which is not drawn to scale:

Figure 1:
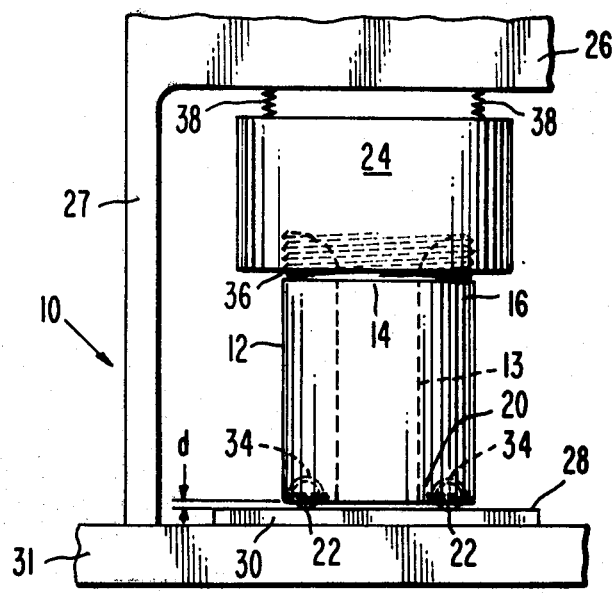
FIG. 1 is a front view of a nozzle embodying the principles of the present invention.
Figure 2:
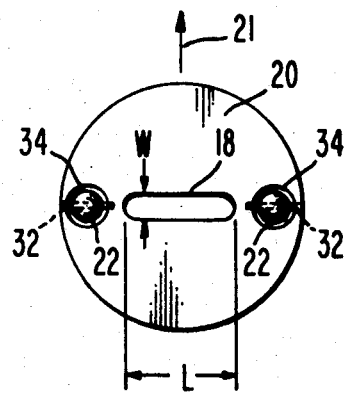
FIG. 2 is a bottom view of the nozzle shown in FIG. 1.

One embodiment of a nozzle for dispensing viscous fluid on a substrate 30 mounted on a base 31, designed according to the principles of the present invention, is generally designated at 10 in FIGS. 1 and 2 and comprises a hollow tubular member 12 having an aperture 13 therethrough with a fluid receiving port 14 at one end 16 and a fluid dispensing orifice 18 at the other end 20. The hollow tubular member 12 has at least two rotationally mounted roller bearings 22 integrally affixed to and extending away from the other, or orifice, end 20 of the hollow tubular member 12 by a preselected distance "d". Although two rotationally mounted roller bearings are shown, other spacing means such as wheels on castors may also be used. During the dispensing of the viscous fluid the roller bearings 22 contact a surface 28 of the substrate 30. The hollow tubular member 12 is cooperatively connected to a fluid reservoir 24 at the one end 16. The reservoir 24 is adapted to regulate, via a piston, gas pressure, or the like, the flow of fluid into the hollow tubular member 12 via the fluid receiving port 14. The fluid reservoir 24 is, in turn, resiliently connected by a plurality of springs 38 to a mounting head 26 which is, in turn, mounted by post 27, for example, to base 31 which serves as a stable base upon which associated equipment can be mounted.

In a specific case, the hollow tubular member 12 has an orifice 18 shaped to produce a thick film line on a surface 28 of a ceramic substrate 30. The shape of the orifice 18 is dependent upon the desired line cross-section, i.e. the desired thickness and width, and the viscosity of the fluid dispensed. For example, if a line having a width of about 0.1 millimeters and a thickness of about 18 micrometers is to be formed using a fluid, more fully discussed below, having a viscosity of between about 150 to 200 centipoise the orifice 18 has a length "L" of about 0.075 millimeters and a width "W" of about 3.8 micrometers. As readily observed the actual dimensions of the orifice 18 are slightly smaller than the desired line dimensions. This sizing is necessary because the viscous fluid expands after it leaves the orifice 18. The amount of expansion of the fluid which occurs from the time the fluid leaves the orifice 18 to the time it is hardened on the surface 28 is principally determimned by three interrelated factors. The first factor is, of course, the viscosity of the fluid. The second factor is the speed at which the fluid hardens, or technically freezes. The third factor, more fully discussed below is the distance between the orifice 18 and the surface 28 of the substrate 30. The first two factors are preordained by the selection of the fluid itself. The hardening time can of course be varied by adjusting, either independently or cooperatively, the temperature of the fluid as it leaves the orifice 18, the temperature of the embodiment atmosphere and the temperature of the substrate 30. One particular viscous fluid useable for thick film circuits and adaptable for use in the nozzle 10 is Cermalloy 4121 which is manufactured and marketed by the Cermalloy Corporation of Conschochochen, Pennsylvania. This fluid generally comprises particles of a metal, e.g. platinum and/or gold, with glass and organic binders.

The third factor, the distance between the orifice 18 and the surface 28, is of major importance because once the viscous fluid is selected the distance is the remaining principle factor which is controllable. Further, the importance of maintaining a continuously uniform distance between the orifice 18 and the substrate 28 can be understood by recognizing that the other two factors mentioned above are fixed and, if the distance from the orifice 18 to the surface 28 is varied during the dispensing of a circuit line, the cross-section of that line will vary due to the changed degree of expansion of the fluid. It is well known that the resistivity of a film circuit line is directly related to its cross-section. Thus, if the cross-section varies along the line so does the resistivity. Such resistivity variation can cause the circuit to be unreliable. It is for these reasons that the nozzle 10 is provided with the two roller bearings 22 which extend away from the other end 20 of the hollow tubular member 12 by a preselected distance.

During the dispensing of the fluid, the pair of roller bearings contact the surface 28 of the substrate 30, thereby maintaining the orifice 18 at a preselected distance therefrom. Preferably, the roller bearings 22 are made from tungsten/carbide or some similarly hard material. The distance between the orifice 18 and the surface 28 is substantially determined by the material characteristics of the fluid and, for the material described above, is between 50 to 75 micrometers. Thus, in this embodiment the roller bearings 22 have a diameter of between 100 and 150 micrometers and are mounted to the hollow tubular member 12, via an axial pin 32 through their centers, at the other, or orifice, end 20 of the hollow member 12. As shown in FIG. 2, the axial pins 32 are positioned substantially perpendicular to the intended direction (indicated by arrow 21) of relative movement between the orifice 18 and the surface 28. If the roller bearings 22 are recess mounted in cavities 34 with each axial pin 32 within each cavity 34 then, in order to maintain the distance "d", the radius of the bearings must be increased by an amount equal to the recess of the pin.

The hollow tubular member 12 is resiliently mounted by springs 38 to the base 26 via the fluid reservoir 24 and the roller bearings 22 contact the surface 28 of the substrate 30 with sufficient pressure to normally compress the springs 38. The resilient mounting, while shown in FIG. 1 as accomplished by the use of the plurality of springs 38, can indeed be effected by any other known means in the art, such as by the use of a pivotal hinge. The only requirement on the resilient mounting of the reservoir 24 to the base 26 is that the degree of resiliency be greater than the largest possible variation in the surface 28 of the substrate 30. That is, the roller bearing 22 must be able to reach the most extreme extents of the surface 28 of the substrate 30. This ensures that the roller bearings 22 can accurately trace the contour of the surface 28 of the substrate 30.

Thus, because of the resilient mounting, the roller bearings 22 can follow the contour of the surface 28 to continuously and uniformly maintain the orifice 18 the distance "d" from the surface 28. During the dispensing of the viscous fluid the substrate 30 and the hollow tubular member 12 are moved laterally relative to each other.

As shown in FIG. 1, the hollow member 12 is cooperatively connected to the fluid reservoir 24 via the one end 16. Preferably, the one end 16 of the hollow member 12 is threaded into the reservoir 22 at an exit port 36 thereof. In the specific case described above, the inside diameter of the hollow member 12 at the one end 16 is about one (1) millimeter.

Figure 3:
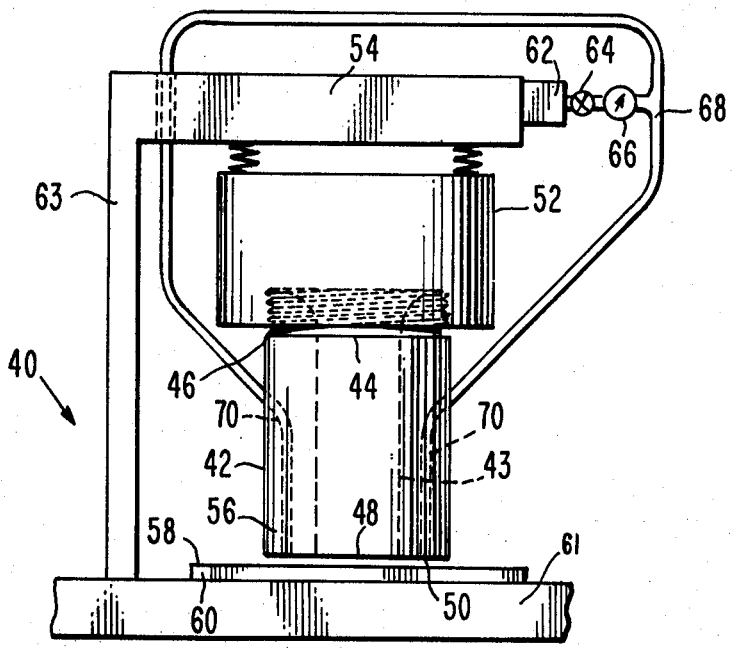
FIG. 3 is a frontal view of another nozzle which also embodies the principles of the present invention.
Figure 4:
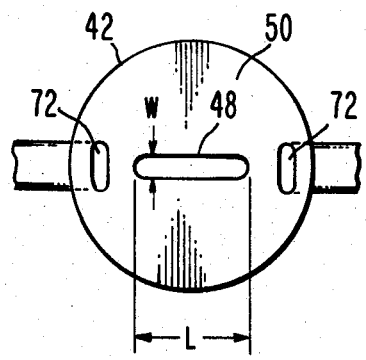
FIG. 4 is a bottom view of the nozzle shown in FIG. 3.

A second embodiment nozzle, indicated generally at 40 in FIGS. 3 and 4 also comprises a hollow tubular member 42 having an aperture 43 with a fluid receiving port 44 at one end 46 thereof and a fluid dispensing orifice 48 at the other end 50. Similarly, the nozzle 40 is connected to a fluid reservoir 52 which is resiliently connected by springs to a base 54. Additionally, and also similar to the nozzle 10 of the earlier described embodiment, the orifice 48 of the nozzle 40 is shaped to produce a thick film circuit line of a preselected cross-section.

The nozzle 40 also integrally includes means for maintaining the orifice 48 of the hollow tubular member 42 a preselected distance "d" above a surface 58 of a substrate 60 on base 61. The base 54 is mounted to the base 61 via post 63. The means 56 in this embodiment for spacing and maintaining the orifice 48 of the hollow tubular member 42 from substrate 60 is a gaseous pressure cushion. The cushion pressure is cooperatively related to the resilient mounting between the reservoir 52 and the base 52 to maintain the orifice 48 a distance "d" above the surface 58 regardless of the curvation of that surface 58.

One practical implementation of the means 56 incorporates a source 62 of gas under pressure, which incidentally, may be mounted to the base 54, which delivers gas to a pressure regulator 64. From the regulator 64 the gas pressure is preferably monitored via a pressure meter 66 from which the gas, at the regulated pressure, is transmitted via gas piping 68 to the hollow tubular member 42. The hollow tubular member 42 includes a plurality of gas paths 70 leading through the tubular walls of member 42 to a plurality of exit ports 72 around the periphery of the orifice 48.

Once the distance "d" is selected, the size and number of paths 70 and exit ports 72, the pressure of the gas and the resiliency of the reservoir 52 mounting to base 54 can be readily determined using techniques known in the art. As previously discussed, the distance "d" is determined primarily by the material characteristics.

Figure 5:
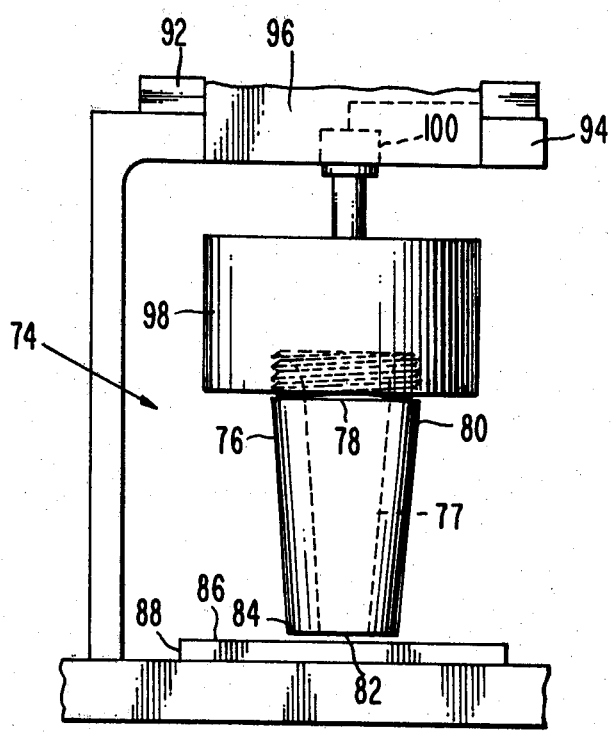
FIG. 5 is a frontal view of yet another nozzle embodying the principles of the present invention.

Yet another nozzle embodiment, indicated generally at 74 in FIG. 5 comprises a hollow tubular member 76 having an aperture 77 therethrough with a fluid receiving port 78 at one end 80 thereof and a fluid dispensing orifice 82 at the other end 84. In all aspects, other than the means for maintaining the orifice 82 a preselected distance "d" above a surface 86 of a substrate 88, the nozzle 74 is like the previously discussed nozzles 10 and 40.

In this embodiment the means 90 for maintaining the spacing of the orifice 82 from a substrate 88 incorporates a servomechanism having a transmitter 92 and a receiver 94. The signals transmitted and received may be sonic or optical or the like. The transmitter 92 and receiver 94 are preferably securely affixed to a base 96 to which a fluid reservoir 98 is movably attached. In one specific example, wherein sonic energy is transmitted to the surface 86 by the transmitter 92, the receiver absorbs an echo signal from the substrate which is then converted, by known means, to an electrical signal. The electrical signal is easily related to the spatial distance of the orifice 82 relative to the surface 86. By use of known comparator means the electrical signal stemming from the echo can be used to drive a height controller mechanism 100 connected to the reservoir 98. The height controller mechanism 100 can be a hydraulic, mechanical, or the like, apparatus.

Each of the nozzles 10, 40 or 74 described above can be fabricated from materials known in the art. Preferably, however, these are constructed from a metal alloy which is capable of withstanding elevated temperatures, without detrimental deformity. The use of elevated temperatures is occasionally necessary to maintain the thick film fluid in a liquid state.

One additional advantage to achieving the capability of maintaining the orifice of the nozzle a preselected distance above a surface without sliding contact therewith is that multilayered thick film elements, i.e. high power resistors, can be easily fabricated without damaging the lower layers when the nozzle passes thereover.

What is claimed is:
1. A nozzle adapted to uniformly dispense a thick film viscous fluid onto a substrate, said nozzle comprising:
a hollow tubular member having a fluid receiving port at one end thereof and a fluid dispensing ori- fice at the other end thereof, said fluid dispensing orifice having a preselected shape and size so that when said fluid is dispensed therethrough said fluid flows in said preselected shape onto said substrate;

a fixedly mounted base for supporting said substrate;

means for resiliently mounting said tubular member to said base and for urging said tubular member toward said substrate; and means cooperatively connected to said tubular member for preventing said orifice from moving closer to said substrate than a predetermined spacial distance, said means for preventing avoiding sliding contact with said substrate.

2. A nozzle as claimed in claim 1 wherein said means for preventing includes a nozzle support member integrally attached to said hollow tubular member and extending beyond said orifice by said predetermined spacial distance for non-sliding contact with said substrate whereby said support member contacts and tracks a surface of said substrate upon which said viscous fluid is dispensed.

3. A nozzle as claimed in claim 2 wherein said support member is at least two roller bearings rotationally affixed to said nozzle.

4. A nozzle as claimed in claim 1 wherein said means for preventing includes:

a source of pressurized gas;

means for delivering said gas to said hollow tubular member; and means, fixed with respect to said hollow tubular member, for directing said gas from said other end of said hollow tubular member whereby said gas provides a gas cushion urging said tubular member away from said substrate for, in cooperation with said resilient means, maintaining said orifice said predetermined distance away from said surface.

5. A nozzle adapted to uniformly dispense a thick film viscous fluid onto a substrate, said nozzle comprising:

a hollow tubular member having a fluid receiving port at one end thereof and a fluid dispensing orifice at the other end thereof, said fluid dispensing orifice having a preselected shape and size so that when said fluid is dispensed therethrough said fluid flows in said preselected shape onto said substrate;

a fixedly mounted base for supporting said substrate;

means for resiliently mounting said tubular member to said base and for urging said tubular member toward said substrate; and means cooperatively connected to said tubular member for preventing said orifice from moving closer to said substrate than a predetermined spacial distance, said means including a source of pressurized gas, means for delivering said gas to said hollow tubular member, and means, integral with said hollow tubular member for directing said gas from said other end of said hollow tubular member whereby said gas provides a gas cushion, maintaining said orifice said predetermined distance away from said substrate.

6. A nozzle as claimed in claim 5 wherein:

said means for delivering further include means for regulating the pressure of said gas;

said means for directing includes an exit port; and said means for regulating is connected to control the pressure of said gas at said exit port.

* * * * *